United States Patent
Ramamurthy

(10) Patent No.: US 9,652,730 B2
(45) Date of Patent: **\*May 16, 2017**

(54) AUTOMATED SYSTEM AND METHOD FOR KNOWLEDGE TRANSFER, AGENT SUPPORT AND PERFORMANCE TRACKING DURING A LIFE CYCLE OF BUSINESS PROCESSES IN AN OUTSOURCING ENVIRONMENT

(71) Applicant: EPIANCE SOFTWARE PVT. LTD., Bangalore (IN)

(72) Inventor: Ravi Ramamurthy, Bangalore (IN)

(73) Assignee: EPIANCE SOFTWARE PVT. LTD., Bangalore, Karnataka (IN)

( * ) Notice: Subject to any disclaimer, the term of this patent is extended or adjusted under 35 U.S.C. 154(b) by 792 days.

This patent is subject to a terminal disclaimer.

(21) Appl. No.: 13/962,035

(22) Filed: Aug. 8, 2013

(65) Prior Publication Data

US 2014/0046720 A1    Feb. 13, 2014

(30) Foreign Application Priority Data

Aug. 8, 2012   (IN) .......................... 3269/CHE/2012

(51) Int. Cl.
| | |
|---|---|
| G06F 9/45 | (2006.01) |
| G06Q 10/06 | (2012.01) |
| G06F 17/50 | (2006.01) |
| B25J 9/16 | (2006.01) |

(52) U.S. Cl.
CPC ....... *G06Q 10/06395* (2013.01); *G06Q 10/06* (2013.01); *B25J 9/1671* (2013.01); *G06F 17/50* (2013.01)

(58) Field of Classification Search
CPC ... G06F 9/455; G06F 17/50; G06Q 10/06395; G06Q 10/06; B25J 9/1671
USPC .......................................... 703/22, 13; 706/8
See application file for complete search history.

(56) References Cited

U.S. PATENT DOCUMENTS

| | | | |
|---|---|---|---|
| 2005/0144150 A1* | 6/2005 | Ramamurthy | G06Q 10/06 706/45 |
| 2005/0147946 A1* | 7/2005 | Ramamurthy | G06Q 99/00 434/118 |
| 2006/0184410 A1* | 8/2006 | Ramamurthy | G06Q 10/10 706/8 |

OTHER PUBLICATIONS

Duo, Wang et al., "Intelligent Multi-Agent Based Information System of Business Process Management", 2008, IEEE Pacific-Asia Workshop on Computational Intelligence and Industrial Application, IEEE.*

(Continued)

*Primary Examiner* — Cedric D Johnson
(74) *Attorney, Agent, or Firm* — Prakash Nama; Global IP Services, PLLC

(57) ABSTRACT

An automated system and method for knowledge transfer, agent support and performance tracking during life cycle of a business process in an outsourcing environment are disclosed. In one embodiment, knowledge information associated with the business process is captured. Further, standard operating procedures (SOPs) are created based on the captured knowledge information. Furthermore, a simulated business process is created based on the captured knowledge information upon reviewing the SOPs. In addition, agents are allowed to use the simulated business process and actual performance of the simulated business process is tracked.

29 Claims, 4 Drawing Sheets

(56) References Cited

OTHER PUBLICATIONS

Wetzstein, Branimir et al., "Monitoring and Analyzing Influential Factors of Business Process Performance", 2009, IEEE International Enterprise Distributed Object Computing Conference, IEEE.*

Kang, Bokyoung et al., "Real-Time Business Process Monitoring Using Formal Concept Analysis", Jun. 2011, Industrial Management and Data Systems, vol. 111, No. 5.*

* cited by examiner

AUTOMATED SYSTEM AND METHOD FOR KNOWLEDGE TRANSFER, AGENT SUPPORT AND PERFORMANCE TRACKING DURING A LIFE CYCLE OF BUSINESS PROCESSES IN AN OUTSOURCING ENVIRONMENT

Benefit is claimed under 35 U.S.C 119(a) to Indian Provisional Application Ser. No. 3269/CHE/2012 entitled "System, method and architecture for dramatically increasing human productivity in a BPO environment by improving human aspects of transitioning, on boarding and stabilization" by Ravi Ramamurthy filed on Aug. 8, 2012.

TECHNICAL FIELD

Embodiments of the present subject matter relate to an outsourcing environment. More particularly, embodiments of the present subject matter relate to knowledge transfer, agent support and performance tracking during a life cycle of business processes in the outsourcing environment.

BACKGROUND

Typically, in an outsourcing environment, business processes of an organization are delegated to service providers having requisite expertise. Generally, to implement the business processes, the service providers perform transitioning and on-boarding of agents. During transitioning, the service providers capture knowledge information associated with the business processes and transfer the knowledge information to the agents. Further, the service providers ensure on-boarding of the agents by providing training on in-house practices of the organization. However, during transition, the knowledge information may be captured and conveyed manually which can be error-prone. Further, training the agents manually may involve time, cost and resources. Also, due to the manual training, the agents may not retain the knowledge information. These challenges may further be aggravated by high attrition rates of the agents. Therefore, the service providers may not be able to successfully meet organization's demands for rapid transition, efficiency, quality and integration with the in-house practices.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

An automated system and method for knowledge transfer, agent support and performance tracking during a life cycle of business processes in an outsourcing environment are disclosed. In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

The term "cloud service" refers to a web service hosted on a cloud network to support various operations, such as storing and transforming various documents, collaborative authoring, managing updated documents and so on.

Figure 1:
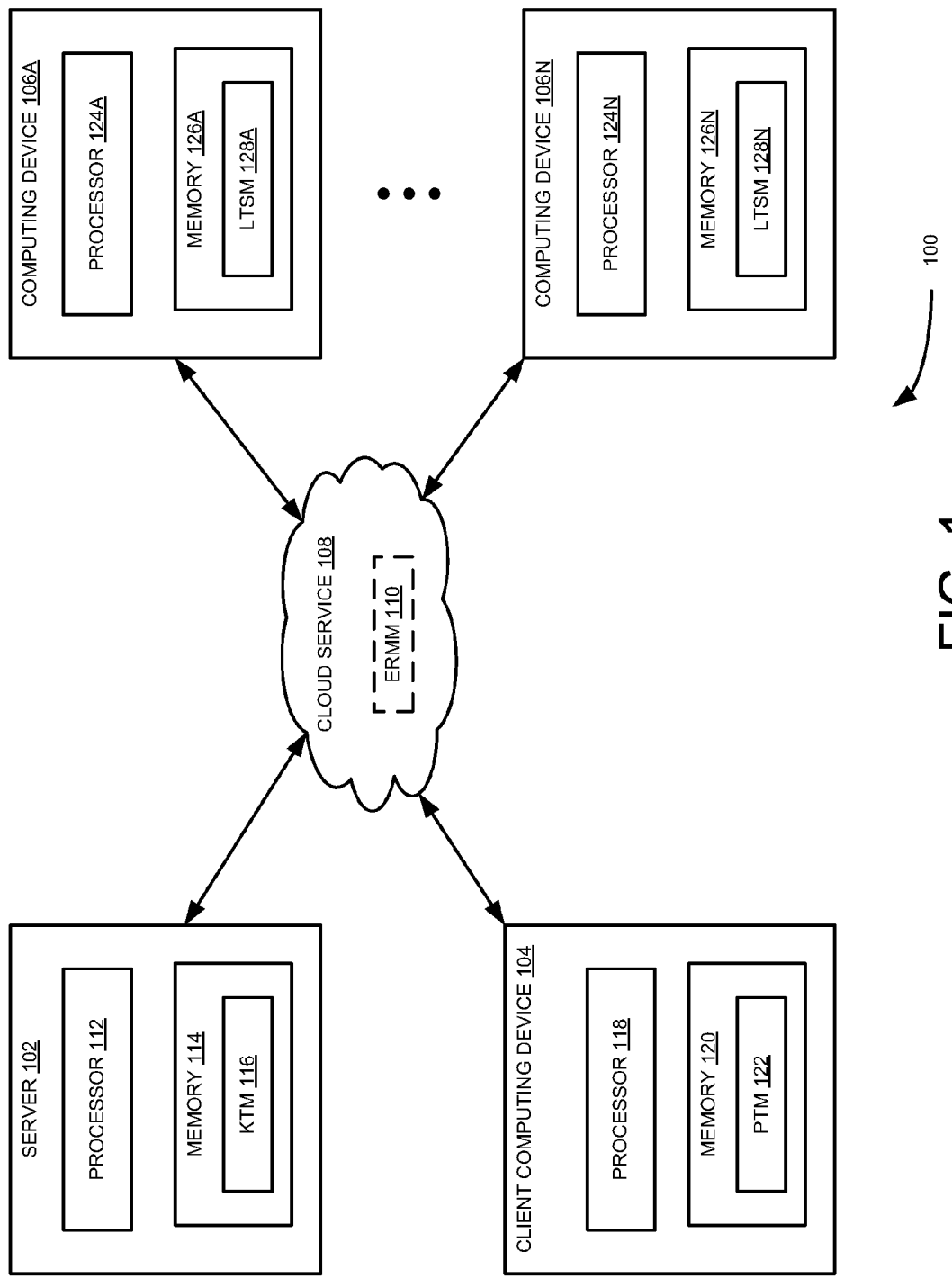
FIG. 1 illustrates an automated system for knowledge transfer, agent support and performance tracking during a life cycle of a business process in an outsourcing environment, according to one embodiment.

FIG. 1 illustrates an automated system 100 for knowledge transfer, agent support and performance tracking during a life cycle of a business process, according to one embodiment. As shown in FIG. 1, the system 100 includes a server 102, a client computing device 104, a plurality of computing devices 106A-N associated with agents and a cloud service 108. Further, the server 102 includes a processor 112 and a memory 114 coupled to the processor 112. Furthermore, the memory 114 includes a knowledge transfer module (KTM) 116. In addition, the client computing device 104 includes a processor 118 and a memory 120 coupled to the processor 118. Moreover, the memory 120 includes a performance tracking module (PTM) 122. Also, the cloud service 108 includes an enterprise resource management module (ERMM) 110. In one example embodiment, the ERMM 110 can reside in the server 102. Further, the computing devices 106A-N include processors 124A-N and memories 126A-N coupled to associated processors 124A-N, respectively. Furthermore, the memories 126A-N include associated live tracking and support modules (LTSMs) 128A-N. In addition as shown in FIG. 1, the server 102, client computing device 104 and the computing devices 106A-N are communicatively coupled to each other via the cloud service 108.

In operation, the KTM 116 captures knowledge information associated with a business process. In one example, the business process includes windows based applications including citrix based applications (i.e., client side applications) and purely image based applications. For example, the knowledge information includes suggestions including actions, screen elements, object properties, screen shots, audio streams, video streams, policies, rules for fields including mandatory or optional information, process workflow, branching information, best practices, time required for the best practices, a number of steps in the best practices, changed steps between two versions of the business process and the like. In one embodiment, the KTM 116 captures the knowledge information when subject matter experts (SMEs) interact with the business process. In this embodiment, the SMEs interact with the business process by performing one or more operations across the business process. The KTM 116 then captures the knowledge information using context strings of the business process. In one example, the KTM 116 uses unique hash codes for every event in the knowledge information to uniquely identify the steps. Any changes in the business process can therefore be easily determined and propagated. In one scenario, the KTM 116 then recreates the knowledge information captured in a particular language of the business process to other languages of the business process. In this scenario, the KTM 116 recreates the knowledge information to the other languages by either rerecording (i.e., playback of the knowledge information on the business process in a different language) or by replacing the knowledge information with the other languages.

Further in operation, the KTM 116 stores the knowledge information in the ERMM 110. Furthermore, the KTM 116 creates standard operating procedures (SOPs) based on the knowledge information stored in the ERMM 110. For example, the SOPs include guidelines for using the business process. The KTM 116 then allows a user of the client computing device 104 to review the SOPs. The KTM 116 further creates a simulated business process based on the knowledge information stored in the ERMM 110 upon reviewing the SOPs. In one embodiment, the KTM 116 creates the simulated business process along with various instructions in the form of manuals, notes, audio streams and the like which help agents in using the simulated business process. For example, the audio streams are created by converting the various instructions from text format to audio format. The KTM 116 then stores the simulated business process along with the SOPs and the various instructions in the ERMM 110.

In addition, the KTM 116 allows the agents to use the simulated business process stored in the ERMM 110 via the associated computing devices 106A-N. Moreover, the KTM 116 tracks actual performance of the simulated business process upon use of the simulated business process by the agents. In one embodiment, the KTM 116 allows the agents to provide feedback, via the associated computing devices 106A-N, on the simulated business process using an intelligent document. The KTM 116 then tracks the actual performance of the simulated business process based on the feedback provided by the agents using the intelligent document. In other words, the KTM 116 tracks usage of the knowledge information when the agents learn, practice, take tests or refer to the knowledge information during training or while using the simulation business process. The KTM 116 then tracks the actual performance of the simulated business process based on the usage of the knowledge information by the agents.

In one example embodiment, the KTM 116 then sends the feedback and the simulated business process to the agents in various geographies based on agent definable parameters and/or stores the feedback and the simulated business process in the ERMM 110. The feedback provided by the agents on the simulated business process allows a business process developer to determine problem areas, productivity issues and bottlenecks much before the business process is deployed to the agents. The KTM 116 can also receive documents from the agents and then update the stored information. In some embodiments, the feedback provided by the agents can be used to improve training materials. The feedback provided by the agents for the simulated business process can also be summarized to fine tune the training materials. Also, the KTM 116 ensures that authoring is done in a closed loop. For example, the authoring is done based on the feedback from the agents.

Also in operation, the KTM 116 creates a live business process based on the actual performance of the simulated business process. Further, the KTM 116 allows the agents to use the live business process via the associated computing devices 106A-N. Furthermore in operation, each of the LTSMs 128A-N provides support for continuous improvement and associated agent adoption of the live business process. In one embodiment, the LTSMs 128A-N generate a context map including contexts (e.g., activities, tasks and the like) in the live business process and associated knowledge information. Each of the LTSMs 128A-N then provides support for the continuous improvement and agent adoption based on the generated context map. In one scenario, the LTSMs 128A-N allows the associated agents to share the knowledge information for specific activities, screens or fields in the live business process amongst multiple agents.

In another embodiment, the LTSMs 128A-N provide support for the continuous improvement by automatically capturing information associated with problems faced by the agents in the live business process and automatically transferring the captured information to a central help desk for quick resolution. For example, the information associated with the problems includes the problems, steps that lead to the problems, actual screens, interactions and the like. In this case, the central helpdesk gets an accurate idea of the nature of the problems based on the captured information and provides context specific support to the agents. In one example, the agents can manually capture the information associated with the problems and send the captured information to the central help desk. In yet another embodiment, the LTSMs 128A-N allow the associated agents to provide feedback on the live business process using a live intelligent document. The LTSMs 128A-N provide support for the continuous improvement and agent adoption based on the feedback provided by the associated agents using the live intelligent document.

In one embodiment, when one or more of the agents associated with the computing devices 106A-N are replaced by new agents, the LTSMs 128A-N train the new agents to use the live business process by using the knowledge information and the SOPs. Further, the LTSMs 128A-N generate training simulations and training content to train the new agents based on the contexts in the live business process. For example, the training simulations include practice simulations and assessment simulations. In one example, the LTSMs 128A-N provide training to the new agents to use the live business process using the training content. The LTSMs 128A-N then provide context based support using the practice simulations and efficacy of knowledge transfer is measured using the assessment simulations while the new agents are using the live business process.

Also in operation, the PTM 122 tracks actual performance of the live business process upon use of the live business process by the agents. In one example, the PTM 122 tracks actual performance of the simulated business process by considering one or more of the agents. In one embodiment, the PTM 122 creates key performance indicators of the live business process. The PTM 122 then tracks the actual performance of the live business process based on the created key performance indicators. Further, the PTM 122 generates performance reports based on the tracked actual performance of the live business process. This is explained in more detailed with reference to FIG. 2.

Figure 2:
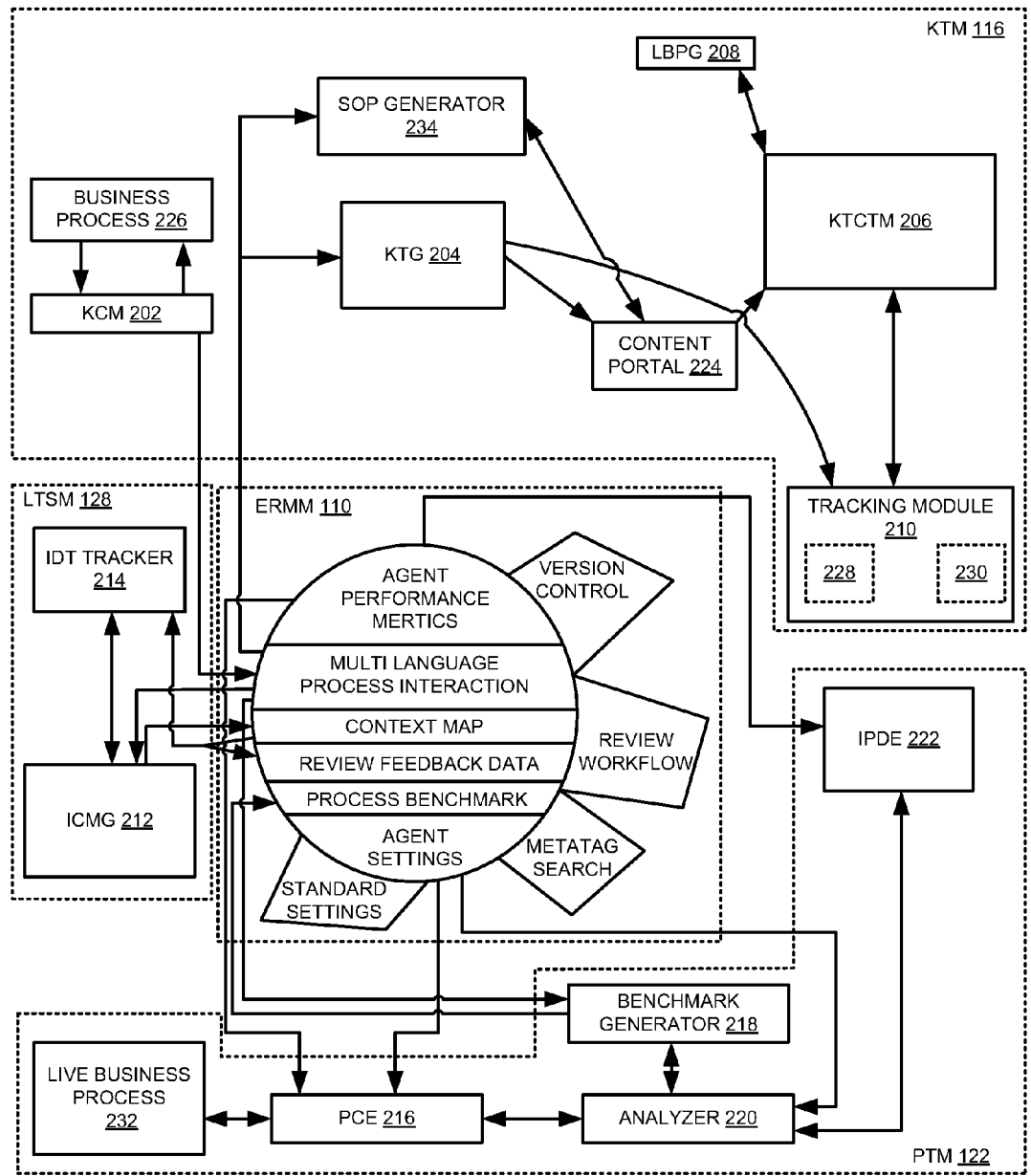
FIG. 2 is a block diagram illustrating components of the system, such as the one shown in FIG. 1, according to one embodiment.

Referring now to FIG. 2, which is a block diagram 200 that illustrates components of the system 100, such as the one shown in FIG. 1, according to one embodiment. Particularly, the block diagram 200 illustrates some of the modules of the KTM 116, a LTSM 128, such as the LTSMs 128A-N of FIG. 1, the PTM 122 and the ERMM 110 of the system 100 of FIG. 1. As shown in FIG. 2, the KTM 116 includes a knowledge information capturing module (KCM) 202, a SOP generator 234, a knowledge information transfer generator (KTG) 204, a knowledge information transfer compliance tracking module (KTCTM) 206, a live business process generator (LBPG) 208, and a tracking module 210 communicatively coupled to each other. Further, the LTSM 128 includes an intelligent dialogue technology context map generator (ICMG) 212 and an intelligent dialogue technology (IDT) tracker 214 communicatively coupled to each other. Furthermore, the PTM 122 includes a process capture engine (PCE) 216, a benchmark generator 218, an analyzer 220 and an intelligent process discovery engine (IPDE) 222 communicatively coupled to each other.

In operation, the KCM 202 seamlessly captures the knowledge information associated with a business process 226. Further, the KCM 202 adds new knowledge information or changes in the captured knowledge information onto the captured knowledge information. In one embodiment, the KCM 202 automatically translates the captured knowledge information in multiple languages. For example, the KCM 202 can be performed in a service (SaaS) model, a flash drive model, a regular mode and the like. In the SaaS model, based on demand, the KCM 202 can be downloaded based on login and other details, copied to temporary directory and executed. In this case, the knowledge information can be stored in a local drive or can be uploaded to the ERMM 110. In the flash drive model, the KCM 202 can be copied in a flash drive or a compact disk (CD). In this case, the knowledge information can be stored in the flash drive or in a local computing device. In the regular model, the KCM 202 stores the knowledge information in a hard disk. This is explained in more detail with reference to FIG. 3.

Further, the SOP generator 234 creates SOPs based on the knowledge information in the ERMM 110. For example, the SOPs include guidelines for using the business process 226. The SOP generator 234 then allows the user of the client computing device 104 to review and sign off the SOPs. The SOP generator 234 then stores the reviewed and signed off SOPs in the ERMM 110 and/or a content portal 224.

Furthermore, in operation, the KTG 204 creates the simulated business process based on the knowledge information upon reviewing and signing off the SOPs. In other words, the KTG 204 obtains and quickly converts the knowledge information into various kinds of content. For example, the various kinds of content include documents for the business process, documents for newer version of the business process 226, the simulated business process for the business process, the simulated business process (which contains all knowledge aspects (tacit knowledge, change management and so on)) for the newer version of the business process 226 and the like. In one embodiment, the KTG 204, using the knowledge information, creates documents with annotation, metadata, step description and tacit knowledge. In one scenario, the KTG 204 customizes look and feel, presentation and language of the simulated business process according to agent preferences. Further, the KTG 204 creates and stores changed document for newer version of the business process 226, multiple language documentation, multiple language simulated business processes and the like in the ERMM 110. In one example, the KTG 204 sends the simulated business process to the content portal 224 and/or the tracking module 210.

In addition, the KTG 204 allows an agent to use the simulated business process stored in the ERMM 110 and/or the content portal 224 via an associated computing device, such as the computing devices 106A-N of FIG. 1. In addition, the KTCTM 206 tracks the actual performance of the simulated business process upon use of the simulated business process by the agent via the computing device. In other words, the KTCTM 206 measures efficacy of the knowledge transfer even before the agent starts working on a live business process 232. The KTCTM 206 then tracks the actual performance of the simulated business process while the agent is using the simulated business process from any source, such as compact discs (CDs) or the computing device.

In one embodiment, the KTCTM 206 allows the agent to provide feedback, via the associated computing device, on the simulated business process using an intelligent document 228 (e.g., an image, a hyper-text markup language (HTML) document, portable document format (pdf) file or any other type of document). For example, the agent can provide transmittal and efficient feedback using the intelligent document 228, store the feedback in the intelligent document 228, retrieve the feedback on wide variety of images from the intelligent document 228 and the like. In this example, the images are translated into the intelligent document 228 and the agent is allowed to circle a field on the images and record the feedback. Filters can then be applied and the agent can view the feedback based on various search criteria. In one example, the feedback can be provided for an entire screen, an entire session, screen objects (which are defined by drawing a circle or clicking at a point and then resizing the circle) and the like which includes properties, such as trackable or non trackable. The KTCTM 206 then tracks the actual performance of the simulated business process based on the feedback provided by the agent using the intelligent document 228. The KTCTM 206 also stores the feedback provided by the agent using the intelligent document 228 in the tracking module 210 and/or the ERMM 110.

In another embodiment, the tracking module 210 tracks usage of the knowledge information as the agent learn, practice, take tests or refer to the knowledge information during training or while using the simulation business process. The tracking module 210 then tracks the actual performance of the simulated business process based on the usage of the knowledge information by the agent. In other words, when the agent uses the simulated business process, the tracking module 210 collects required preferences and usage of the simulated business process and then tracks the actual performance of the simulated business process based on the required preferences. In this embodiment, the agent who is using the simulated business process can be tracked either by domain authentication or by an agent profile form.

Also in operation, the LBPG 208 generates a live business process 232 based on the actual performance of the simulated business process. The LBPG 208 then allows the agent to use the live business process 232. In addition, the LTSM 128 provides support for continuous improvement and agent adoption of the live business process 232. In one embodiment, the ICMG 212 generates the context map including contexts in the live business process 232 and associated knowledge information. For example, the context includes activities, tasks and the like in the live business process 232. In this embodiment, the ICMG 212 obtains tacit knowledge, offline content and external content to link the contexts in the live business process 232 and the knowledge information based on parameters, such as content keywords, context ignore words, and application/domain identifiers and the like. In case of the offline content, the ICMG 212 links the contexts and the knowledge information automatically. In case of the external content, the ICMG 212 links the contexts and the knowledge information with intervention of the agent. Furthermore, the ICMG 212 generates the context map between the contexts and the knowledge information based on the links and adds additional information, such as context identifiers, key words when the context have dynamic portions, application identifiers for browser based applications, content search keywords and the like. The ICMG 212 then sends the context map to the IDT tracker 214 and/or the tracking module 210.

Moreover, the IDT tracker 214 sends the associated knowledge information to the agent as context sensitive assistance to use the live business process 232. In one example embodiment, the IDT tracker 214 indentifies the context based on interactions of the agent with the live business process 232 and obtains the knowledge information associated with the context from the context map. The IDT tracker 214 then provides support to the agent by sending the knowledge information associated with the context for the continuous improvement and agent adoption. In one example, the IDT tracker 214 automatically provides the knowledge information for the context as a popup when the agent reaches the context. Also, the IDT tracker 214 obtains continuous status notifications about the live business process 232 upon use of the received knowledge information by the agent.

Further, the IDT tracker 214 trains the new agents to use the live business process 232 using the knowledge information and the SOPs. In addition, the IDT tracker 214 generates training simulations and training content to train the new agents based on the contexts in the live business process 232. For example, the training simulations include practice simulations and assessment simulations. In one example, the IDT tracker 214 generates the training simulations in dynamic hyper text markup language (DHTML), flash formats and the like. In one scenario, the IDT tracker 214 provides the generated training content to the new agents through a learning management system (LMS) or web based training such that the training content is provided to the new agents contextually using the ICMG 212.

In another embodiment, the LTSM 128 allow the agent to send feedback on the live business process 232 and the received knowledge information including the tacit knowledge using a live intelligent document 230. The LTSM 128 then provides support for the continuous improvement and agent adoption based on the feedback provided by the agent using the live intelligent document 230.

In one example, when the agent is using a word document, the IDT tracker 214 tracks interactions of the agent with the word document. Further, the IDT tracker 214 tracks a context (e.g., save, save as, print and the like) in the word document based on the agent's interactions. Furthermore, the IDT tracker 214 provides support to the agent by obtaining knowledge information associated with the context from the context map.

Further in operation, the PTM 122 tracks actual performance of the live business process 232 upon use of the live business process 232 by the agent. In one embodiment, the PTM 122 creates key performance indicators of the live business process. The PTM 122 then tracks the actual performance of the live business process 232 based on the created key performance indicators. In another embodiment, the PTM 122 tracks actual performance/compliance of the live business process 232 based on the best practices of the agent and/or the SMEs. Furthermore, the PTM 122 generates performance reports based on the actual performance of the live business process 232.

In the above embodiments, the benchmark generator 218 allows the SMEs to define processes in the live business process 232 and sub-divide the processes into unit processes and benchmarks (e.g., a number of steps, duration, a number of warnings and so on) to measure 'completed' and 'aborted' processes. For example, the unit processes includes a combination of steps (defined based on step patterns, such as an application name, a window name, a uniform resource locator (URL) (in case of web based applications), a control name, a control type, a unique control identifier and the like).

Further, the PCE 216 captures the interactions between the agent and the live business process 232 and compares steps performed by the agent while interacting with the live business process 232 to the defined unit processes to automatically identify the unit processes performed by the agent. Furthermore, the analyzer 220 allows a user associated with the client computing device 104 to select the agent to be monitored based on capture preferences, specify the processes that should or should not be captured, set schedules for the time of capture and the like. In addition, the IPDE 222 tracks the actual performance of the live business process 232 based on the benchmarks using regular expressions and hash keys. The IPDE 222 also generates reports providing statistics of the agent following a particular process to help an organization identify the best/worst performing agent and marks processes as complete/incomplete/aborted based on whether the agent reached the completion status. In one example, control charts are provided to identify the process control limits across the organization. The reports can also be customized based on the need of the organization.

Figure 3:
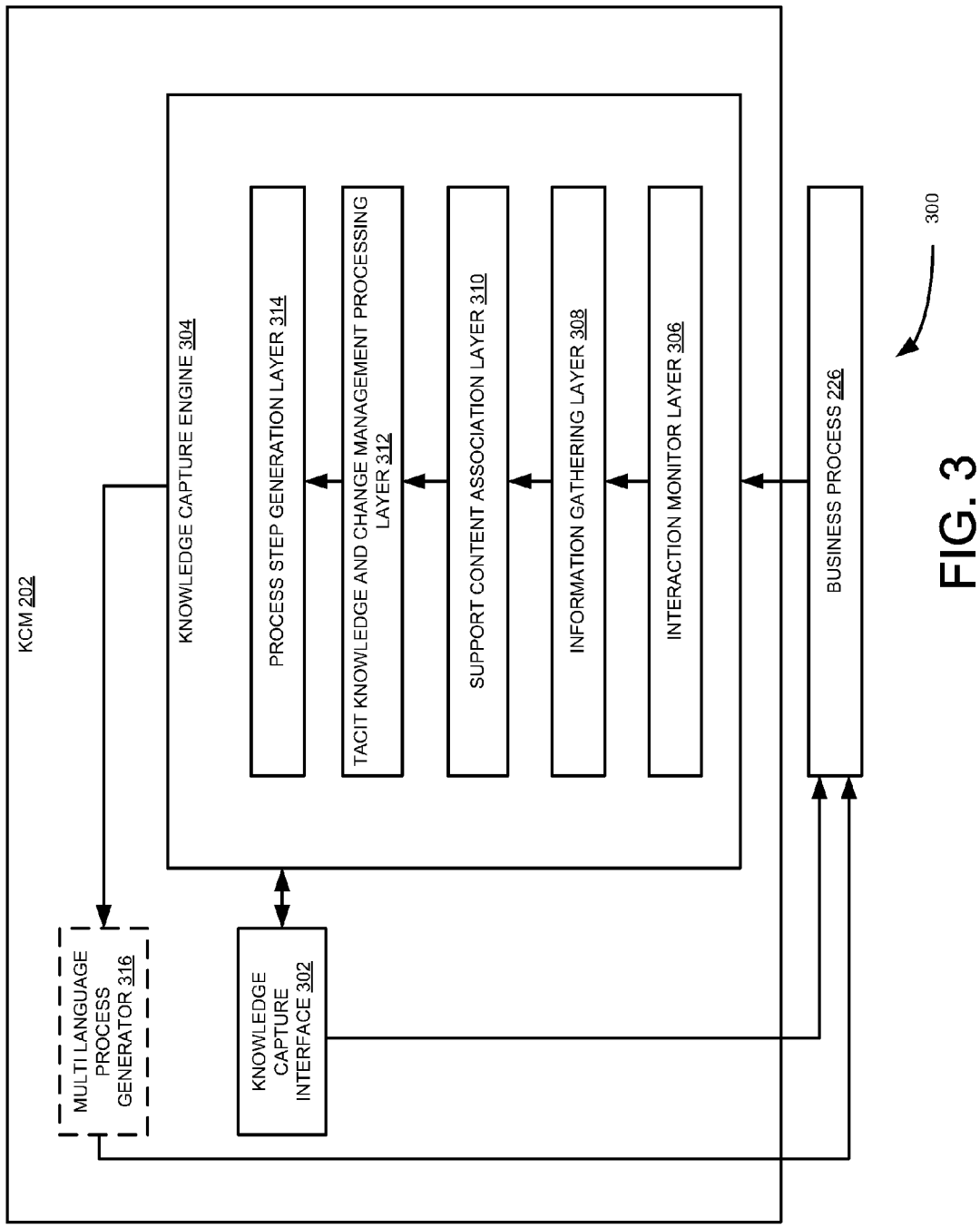
FIG. 3 is a block diagram illustrating a knowledge information capture module (KCM), such as the one shown in FIG. 2, according to one embodiment.

Referring now to FIG. 3, which is a block diagram 300 illustrating the KCM 202, such as the one shown in FIG. 2, according to one embodiment. As shown in FIG. 3, the KCM 202 includes a knowledge capture interface 302, a knowledge capture engine 304, the business process 226 and a multi language process generator 316. Further, the knowledge capture engine 304 includes an interaction monitor layer 306, an information gathering layer 308, a supportive content association layer 310, a tacit knowledge and change management processing layer 312 and a process step generation layer 314. Furthermore, the knowledge capture interface 302, the knowledge capture engine 304, the business process 226 and the multi language process generator 316 are communicatively coupled to each other.

In one embodiment, the knowledge capture interface 302 allows the SMEs to set capture preferences. Further, the knowledge capture engine 304 captures the knowledge information including details of interactions between the SMEs and the business process 226 (e.g., 32 bit or 64 bit application) based on the capture preferences. Furthermore, the knowledge capture engine 304 converts the details into meaningful sentences. In other words, the knowledge capture engine 304 gets maximum information associated with the business process 226 without affecting SME's experience and deletes duplicate and unwanted information. For example, the details of the interactions include an application name, a current dialog caption and associated window co-ordinates, a type of windows message and its properties, and a name and location of a control (e.g., changed process, new process, audio/video, tacit knowledge, manual interactions and the like) with which the SMEs are interacting.

In one example, the interaction monitor layer 306 monitors messages generated in the business process 226 as a result of the interaction by the SMEs to get basic information about a type of action, a region of interaction, the name of the control and the like. Further, the information gathering layer 308 collects the knowledge information using different plug-ins suitable for a type of the business process 226. For example, the type of business process 226 includes SAP®, Oracle®, Peoplesoft, and Siebel® kind of enterprise resource planning (ERP), Catia® and uni-graphics never execute (UG-NX) kind of graphics designing tools, all sorts of applets, apps, portals running in browsers like Internet Explorer® (IE), Firefox® and so on, Rumba®, IBM® PComm, Hummingbird®, Esker® kind of Green screen emulators for legacy mainframe and OS/400® environment, applications running via Citrix® framework, all Java® desktop applications running in IE browser, and all Visual Basic® (VB), Microsoft® Dotnet and win32® based desktop tools in 32 and 64 bit operating system (OS) environment. The information gathering layer 308 also collects the knowledge information associated with business processes which have graphical elements, such as a button and the like but are purely images. This is done through algorithms to determine the type of control, the name, the category and the like.

Furthermore, the support content association layer 310 captures the images and audio and/or video streams associated with the business process 226. In addition, the tacit knowledge and change management processing layer 312 tags the business process 226 with the tacit knowledge information provided by the SMEs and changes in the business process 226. In one example, tacit knowledge and change management processing layer 312 automatically knows the changes as each step is uniquely encoded. The tacit knowledge and change management processing layer 312 also facilitates editing of the knowledge information (sentences, control level raw information, region redrawing, image replacement, image masking, security and alias name definition for controls and so on). Also, the process step generation layer 314 generates the meaningful sentences along with the suitable images and other associative contents like external audio and/or video streams, screen flow video and so on. Moreover, the multi language process generator 316, an optional layer, re-generates the meaningful sentences into different languages with all associated content.

Figure 4:
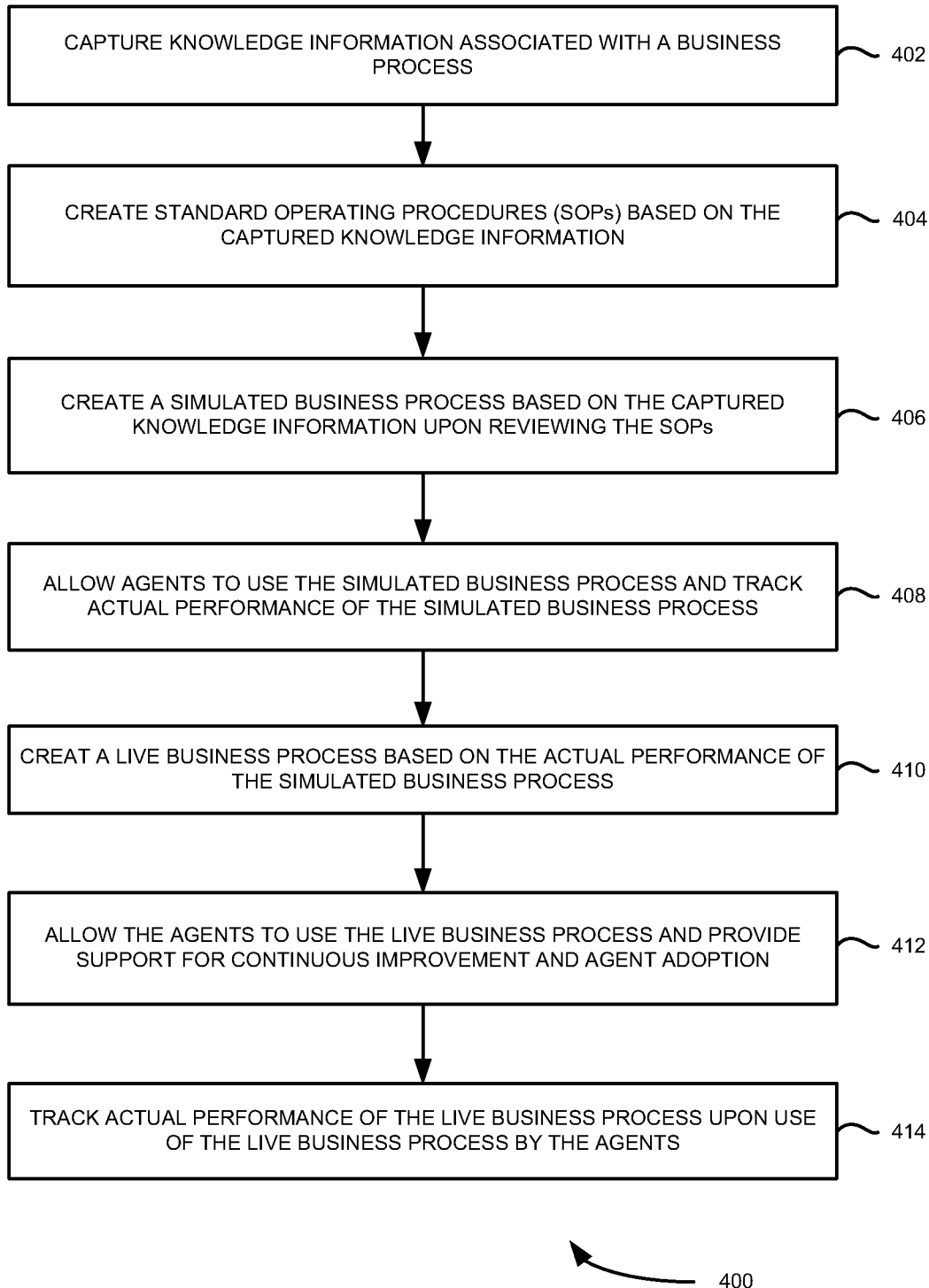
FIG. 4 illustrates a flow chart of an automated method for knowledge transfer, agent support and performance tracking during the life cycle of the business process in the outsourcing environment, according to one embodiment.

Referring now to FIG. 4, which illustrates a flowchart 400 of an automated method for knowledge transfer, agent support and performance tracking during a life cycle of a business process, according to one embodiment. At step 402, knowledge information associated with the business process is captured. At step 404, SOPs are created based on the captured knowledge information. At step 406, a simulated business process is created based on the captured knowledge information upon reviewing the SOPs. At step 408, agents are allowed to use the simulated business process and actual performance of the simulated business process is tracked. At step 410, a live business process is created based on the actual performance of the simulated business process. At step 412, the agents are allowed to use the live business process and support for continuous improvement and agent adoption is provided to the agents. At step 414, actual performance of the live business process is tracked upon use of the live business process by the agents. This is explained in more detail with reference to FIGS. 1-3.

In various embodiments, the systems and methods described in FIGS. 1-4 propose a technique to transfer the knowledge information during the life cycle of the business process to the agents. The proposed technique provides a combination of automatic capture of the knowledge information, automatic transfer of the knowledge information, automatic analysis of the business process using the simulated business process and context based support for the agents to enable the organizations to implement the business process and/or updated business process with minimized risk, better agent adoption, reduced impact of high attrition rates of the agents, reduced cost of production and maintenance of the training content, higher return on investments (ROIs) with continuous improvement of the business process. Further, the technique enables the agents to work on the simulated business processes associated with the live business process, thus reduces the cost of updating the live business process. Furthermore, the technique automatically enables the agents to peruse only through the modifications by updating only modifications in the live business process.

In one embodiment, an article comprising a non-transitory computer readable storage medium having instructions thereon which when executed by a computing platform result in execution of the above mentioned method. The method described in the foregoing may be in a form of a machine-readable medium embodying a set of instructions that, when executed by a machine, causes the machine to perform any method disclosed herein. It will be appreciated that the various embodiments discussed herein may not be the same embodiment, and may be grouped into various other embodiments not explicitly disclosed herein.

Although certain methods, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

I claim:

1. An automated method, comprising:
    capturing knowledge information associated with a business process;
    creating standard operating procedures (SOPs) based on the captured knowledge information;
    creating, using a computer, a simulated business process based on the captured knowledge information upon reviewing the SOPs;
    allowing agents to use the simulated business process and tracking actual performance of the simulated business process, wherein tracking the actual performance of the simulated business process comprises:
        allowing the agents to provide feedback on the simulated business process using an intelligent document, wherein the feedback and the simulated business process is associated with agent definable parameters, and wherein intelligent document allows the agent to provide transmittal and efficient feedback, including interacting with image data and modifying screen objects and properties associated with the intelligent document, and apply filters to view feedback based on various search criteria, in order to provide the feedback;
        tracking the actual performance of the simulated business process based on the feedback provided by the agents using the intelligent document; and
    creating, by the agents using the computer, a live business process based on the tracking of the actual performance of the simulated business process;
    allowing the agents to use the live business process; and
    providing support for agent adoption and continuously improving the live business process based on the created live business process.

2. The automated method of claim 1, wherein providing support for the continuous improvement and agent adoption, comprises:
    generating a context map including contexts in the live business process and associated captured knowledge information; and
    providing support for the continuous improvement and agent adoption based on the generated context map.

3. The automated method of claim 1, wherein providing support for the continuous improvement and agent adoption, comprises:
  allowing the agents to provide feedback on the live business process using a live intelligent document; and
  providing support for the continuous improvement and agent adoption based on the feedback provided by the agents using the live intelligent document.

4. The automated method of claim 1, wherein providing support for the continuous improvement and agent adoption, comprises:
  capturing information associated with problems faced by the agents in the live business process; and
  transferring the captured information to a central help desk for quick resolution.

5. The automated method of claim 1, further comprising:
  tracking actual performance of the live business process upon use of the live business process by the agents.

6. The automated method of claim 5, further comprising:
  generating performance reports based on the actual performance of the live business process.

7. The automated method of claim 5, wherein tracking the actual performance of the live business process, comprises:
  creating key performance indicators of the live business process; and
  tracking the actual performance of the live business process based on the created key performance indicators.

8. The automated method of claim 1, further comprising:
  training new agents to use the live business process using the captured knowledge information and the SOPs.

9. The automated method of claim 1, wherein the knowledge information includes actions, screen elements, object properties, screen shots, audio streams, video streams, policies, rules for fields including mandatory or optional information, process workflow, and/or branching information.

10. The automated method of claim 1, wherein the SOPs include guidelines for using the business process.

11. An automated system, comprising:
  a cloud service, comprising:
    an enterprise resource management module (ERMM); and
  a server communicatively coupled to the cloud service, comprising:
    a knowledge transfer module (KTM), wherein the KTM is configured to:
      capture knowledge information associated with a business process;
      create standard operating procedures (SOPs) based on the captured knowledge information;
      create, using a computer, a simulated business process based on the captured knowledge information upon reviewing the SOPs and store the simulated business process, the SOPs and the captured knowledge information in the ERMM; and
      allow agents to use the simulated business process and track actual performance of the simulated business process, wherein tracking the actual performance of the simulated enterprise application comprises:
        allowing the agents to provide feedback on the simulated business process using an intelligent document, wherein the feedback and the simulated business process is associated with agent definable parameters, and wherein intelligent document allows the agent to provide transmittal and efficient feedback, including interacting with image data and modifying screen objects and properties associated with the intelligent document, and apply filters to view feedback based on various search criteria, in order to provide the feedback;
        tracking the actual performance of the simulated business process based on the feedback provided by the agents using the intelligent document;
        creating, by the agents using the computer, a live business process based on the tracking of the actual performance of the simulated business process; allowing the agents to use the live business process; and
        providing support for agent adoption and continuously improving the live business process based on the created live business process.

12. The automated system of claim 11, further comprising:
  a plurality of computing devices associated with the agents, wherein the plurality of computing devices are communicatively coupled to the cloud service and wherein each of the plurality of computing devices includes a live tracking and support module (LTSM) to provide support for continuous improvement and agent adoption of the live business process.

13. The automated system of claim 12, wherein the LTSM is configured to:
  generate a context map including contexts in the live business process and associated captured knowledge information; and
  provide support for the continuous improvement and agent adoption based on the generated context map.

14. The automated system of claim 12, wherein the LTSM is configured to:
  allow the agents to provide feedback on the live business process using a live intelligent document; and
  provide support for the continuous improvement and agent adoption based on the feedback provided by the agents using the live intelligent document.

15. The automated system of claim 12, wherein the LTSM is further configured to:
  train new agents to use the live business process using the captured knowledge information and the SOPs.

16. The automated system of claim 11, further comprising:
  a client computing device communicatively coupled to the cloud service, wherein the client computing device comprises a performance tracking module (PTM) to track actual performance of the live business process upon use of the live business process by the agent.

17. The automated system of claim 16, wherein the PTM is further configured to:
  generate performance reports based on the actual performance of the live business process.

18. The automated system of claim 16, wherein the PTM is configured to:
  create key performance indicators of the live business process; and
  track the actual performance of the live business process based on the created key performance indicators.

19. The automated system of claim 11, wherein the knowledge information includes actions, screen elements, object properties, screen shots, audio streams, video streams, policies, rules for fields including mandatory or optional information, process workflow, and/or branching information.

20. The automated system of claim 11, wherein the SOPs include guidelines for using the business process.

21. A non-transitory computer-readable storage medium having instructions that when executed by a computing device, cause the computing device to:
 capture knowledge information associated with a business process;
 create standard operating procedures (SOPs) based on the captured knowledge information;
 create, using a computer, a simulated business process based on the captured knowledge information upon reviewing the SOPs;
 allow agents to use the simulated business process and tracking actual performance of the simulated business process, wherein tracking the actual performance of the simulated business process comprises:
  allowing the agents to provide feedback on the simulated business process using an intelligent document, wherein the feedback and the simulated business process is associated with agent definable parameters, and wherein intelligent document allows the agent to provide transmittal and efficient feedback, including interacting with image data and modifying screen objects and properties associated with the intelligent document, and apply filters to view feedback based on various search criteria, in order to provide the feedback;
 tracking the actual performance of the simulated business process based on the feedback provided by the agents using the intelligent document;
 creating, by the agents using the computer, a live business process based on the tracking of the actual performance of the simulated business process;
 allowing the agents to use the live business process; and
 providing support for agent adoption and continuously improving the live business process based on the created live business process.

22. The non-transitory computer-readable storage medium of claim 21, wherein providing support for the continuous improvement and agent adoption, comprises:
 generating a context map including contexts in the live business process and associated captured knowledge information; and
 providing support for the continuous improvement and agent adoption based on the generated context map.

23. The non-transitory computer-readable storage medium of claim 21, wherein providing support for the continuous improvement and agent adoption, comprises:
 allowing the agents to provide feedback on the live business process using a live intelligent document; and
 providing support for the continuous improvement and agent adoption based on the feedback provided by the agents using the live intelligent document.

24. The non-transitory computer-readable storage medium of claim 21, further comprising:
 tracking actual performance of the live business process upon use of the live business process by the agents.

25. The non-transitory computer-readable storage medium of claim 24, further comprising:
 generating performance reports based on the actual performance of the live business process.

26. The non-transitory computer-readable storage medium of claim 24, wherein tracking the actual performance of the live business process, comprises:
 creating key performance indicators of the live business process; and
 tracking the actual performance of the live business process based on the created key performance indicators.

27. The non-transitory computer-readable storage medium of claim 21, further comprising:
 training new agents to use the live business process using the captured knowledge information and the SOPs.

28. The non-transitory computer-readable storage medium of claim 21, wherein the knowledge information includes actions, screen elements, object properties, screen shots, audio streams, video streams, policies, rules for fields including mandatory or optional information, process workflow, and/or branching information.

29. The non-transitory computer-readable storage medium of claim 21, wherein the SOPs include guidelines for using the business process.

* * * * *